United States Patent
Park et al.

(10) Patent No.: US 12,320,032 B2
(45) Date of Patent: Jun. 3, 2025

(54) FERROELECTRIC THIN FILM AND FORMING METHOD THEREOF

(71) Applicants: SEOUL NATIONAL UNIVERSITY R&DB FOUNDATION, Seoul (KR); INSTITUTE FOR BASIC SCIENCE, Daejeon (KR)

(72) Inventors: Jungwon Park, Seoul (KR); Kunwoo Park, Seoul (KR)

(73) Assignees: SEOUL NATIONAL UNIVERSITY R&DB FOUNDATION, Seoul (KR); INSTITUTE FOR BASIC SCIENCE, Daejeon (KR)

(*) Notice: Subject to any disclaimer, the term of this patent is extended or adjusted under 35 U.S.C. 154(b) by 203 days.

(21) Appl. No.: 18/193,483

(22) Filed: Mar. 30, 2023

(65) Prior Publication Data

US 2023/0323562 A1  Oct. 12, 2023

(30) Foreign Application Priority Data

Apr. 6, 2022  (KR) .................... 10-2022-0043122

(51) Int. Cl.
| | | |
|---|---|---|
| C30B 29/16 | (2006.01) | |
| C30B 1/02 | (2006.01) | |
| C30B 29/68 | (2006.01) | |

(52) U.S. Cl.
CPC .............. C30B 29/16 (2013.01); C30B 1/026 (2013.01); C30B 29/68 (2013.01)

(58) Field of Classification Search
CPC ......... C30B 29/16; C30B 1/026; C30B 29/68; C30B 25/02; C30B 25/12
See application file for complete search history.

(56) References Cited

U.S. PATENT DOCUMENTS

| | | | |
|---|---|---|---|
| 2003/0015704 A1* | 1/2003 | Curless ............. | H01L 21/02513 257/E21.12 |
| 2019/0244973 A1* | 8/2019 | Yoo ........................ | H01L 21/22 |
| 2021/0202508 A1 | 7/2021 | Jeon | |

FOREIGN PATENT DOCUMENTS

KR   10-2021-0085460 A   7/2021

OTHER PUBLICATIONS

Lupina et al, "Nucleation and growth of HfO2 layers on graphene by chemical vapor deposition" Appl. Phys. Lett. 103, 183116 (2013).*

Xiao et al, "Performance Improvement of Hf0.5Zr0.5O2-Based Ferroelectric-Field-Effect Transistors With ZrO2 Seed Layers" IEEE Electron Device Letters, vol. 40, No. 5, May 2019 pp. 714-717.*

Lvkang Shen et al., "Epitaxial Lift-Off of Centimeter-Scaled Spinel Ferrite Oxide Thin Films for Flexible Electronics," Adv. Mater., 2017.

Jing Cao et al., "An Overview of Ferroelectric Hafnia and Epitaxial Growth," Phys. Status Solidi RRL, 2021.

\* cited by examiner

*Primary Examiner* — Robert M Kunemund

(57) ABSTRACT

A ferroelectric thin film and a forming method thereof are provided. The method of forming a ferroelectric thin film according to embodiments of the present invention comprises forming a sacrificial seed layer on a first substrate, forming a ferroelectric thin film on the sacrificial seed layer, and transferring the ferroelectric thin film to a second substrate. The ferroelectric thin film according to embodiments of the present invention is formed by the method.

10 Claims, 7 Drawing Sheets

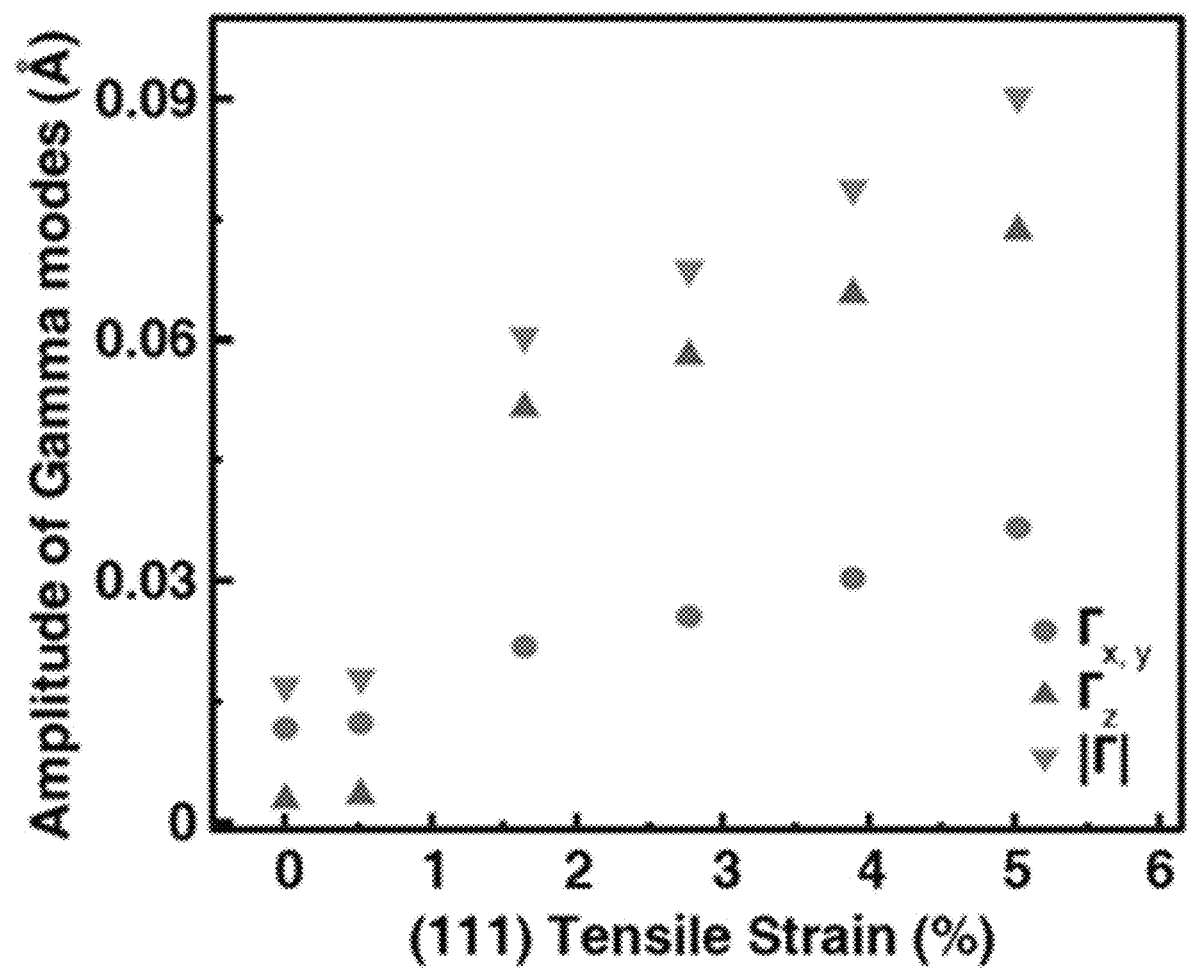
F i g. 9

FERROELECTRIC THIN FILM AND FORMING METHOD THEREOF

BACKGROUND OF THE INVENTION

1. Field of the Invention

The present invention relates to a ferroelectric thin film and a forming method thereof.

2. DESCRIPTION OF THE RELATED ART $HfO_2$ thin films have strong ferroelectricity at nanoscale domain sizes. In order for the $HfO_2$ thin film to have strong ferroelectricity, a high-temperature treatment process such as high-temperature deposition is essential. In addition, crystallographic characteristics of the $HfO_2$ thin film are not clear because it is very difficult to identify phases through conventional analysis due to the nanometer-scale thickness and polycrystalline properties of the film.

SUMMARY OF THE INVENTION

The present invention provides a method for stably forming a ferroelectric thin film.

The present invention provides a ferroelectric thin film formed by the method.

The other objects of the present invention will be clearly understood with reference to the following detailed description and the accompanying drawings.

The method of forming a ferroelectric thin film according to embodiments of the present invention comprises forming a sacrificial seed layer on a first substrate, forming a ferroelectric thin film on the sacrificial seed layer, and transferring the ferroelectric thin film to a second substrate.

The first substrate may comprise a STO ($SrTiO_3$) substrate, the sacrificial seed layer may comprise a LSMO ($La_{0.7}Sr_{0.3}MnO_3$) layer, and the ferroelectric thin film may comprise a $HfO_2$ thin film. The $HfO_2$ thin film may be doped with yttrium (Y).

The ferroelectric thin film may be formed by epitaxial growth from the sacrificial seed layer.

The transferring of the ferroelectric thin film may comprise removing the sacrificial seed layer.

The crystal structure of the ferroelectric thin film may be controlled by the thickness of the ferroelectric thin film.

The ferroelectric thin film may comprise a $HfO_2$ thin film, and the $HfO_2$ thin film may be composed of t-phase at a first thickness and composed of o-phase at a second thickness greater than the first thickness.

The ferroelectric thin film may comprise a $HfO_2$ thin film, and the $HfO_2$ thin film may have a compressively strained symmetric phase disposed between o-phase domains.

The method may further comprise forming a support layer on the ferroelectric thin film. The ferroelectric thin film may be transferred using the support layer.

The ferroelectric thin film according to embodiments of the present invention is formed by the method.

According to embodiments of the present invention, a ferroelectric thin film can be stably formed. For example, since a ferroelectric thin film can be formed at room temperature using a transfer process, various electronic devices can be stably formed without deterioration of ferroelectricity or damage to a substrate. In addition, a ferroelectric thin film having a clear crystal structure can be formed.

BRIEF DESCRIPTION OF THE DRAWINGS

The above and other objects, features and advantages of the present invention will be more clearly understood from the following detailed description taken in conjunction with the accompanying drawings, in which:

FIG. 9 shows the change in the amplitude of $\Gamma_{15}^x$, $\Gamma_{15}^y$, $\Gamma_{15}^z$ phonons according to the tensile strain in the $\{111\}$ lattice of the $HfO_2$ thin film.

DESCRIPTION OF SPECIFIC EMBODIMENTS

Figure 1:
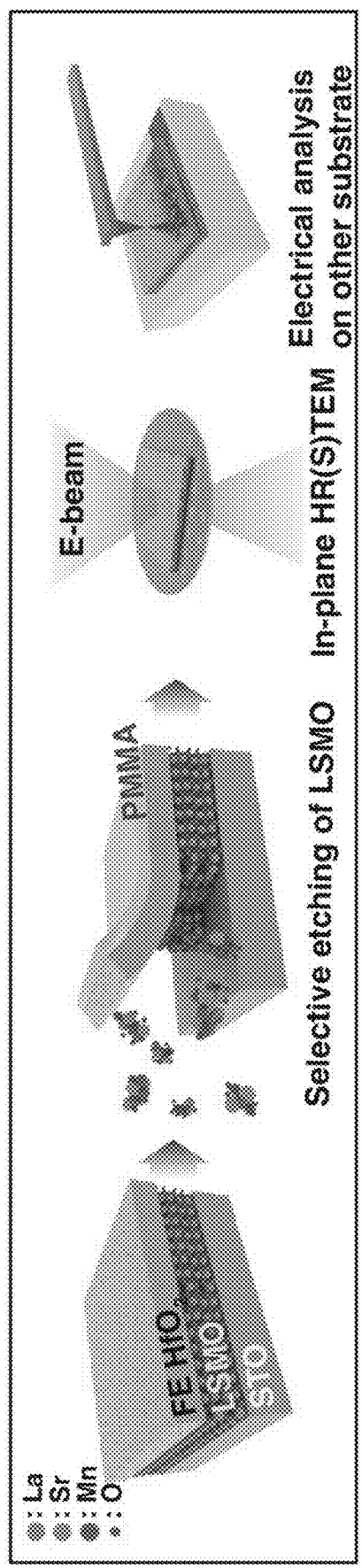
FIG. 1 shows a method of forming a ferroelectric thin film according to an embodiment of the present invention.

Hereinafter, a detailed description will be given of the present invention with reference to the following embodiments. The purposes, features, and advantages of the present invention will be easily understood through the following embodiments. The present invention is not limited to such embodiments, but may be modified in other forms. The embodiments to be described below are nothing but the ones provided to bring the disclosure of the present invention to perfection and assist those skilled in the art to completely understand the present invention. Therefore, the following embodiments are not to be construed as limiting the present invention.

Terms like 'first', 'second', etc., may be used to indicate various components, but the components should not be restricted by the terms. These terms are only used to distinguish one element, component, region, layer or section from another region, layer or section. A first element, component, region, layer or section could be termed a second element, component, region, layer or section without departing from the teaching of the embodiments of the present invention. It will be understood that when an element is referred to as being "on" another element, it can be directly on the other element or intervening elements may be present therebetween.

The terminology used herein is for the purpose of describing particular embodiments only and is not intended to limit the invention. It is to be understood that the singular forms "a," "an," and "the" include plural references unless the context clearly dictates otherwise. It will be further understood that the terms "comprises" or "has," when used in this specification, specify the presence of stated features, integers, steps, operations, elements, and/or components, but do not preclude the presence or addition of one or more other features, integers, steps, operations, elements, components, and/or groups thereof.

The method of forming a ferroelectric thin film according to embodiments of the present invention comprises forming a sacrificial seed layer on a first substrate, forming a ferroelectric thin film on the sacrificial seed layer, and transferring the ferroelectric thin film to a second substrate.

The first substrate may comprise a STO (SrTiO$_3$) substrate, the sacrificial seed layer may comprise a LSMO (La$_{0.7}$Sr$_{0.3}$MnO$_3$) layer, and the ferroelectric thin film may comprise a HfO$_2$ thin film. The HfO$_2$ thin film may be doped with yttrium (Y).

The ferroelectric thin film may be formed by epitaxial growth from the sacrificial seed layer.

The transferring of the ferroelectric thin film may comprise removing the sacrificial seed layer.

The crystal structure of the ferroelectric thin film may be controlled by the thickness of the ferroelectric thin film.

The ferroelectric thin film may comprise a HfO$_2$ thin film, and the HfO$_2$ thin film may be composed of t-phase at a first thickness and composed of o-phase at a second thickness greater than the first thickness.

The ferroelectric thin film may comprise a HfO$_2$ thin film, and the HfO$_2$ thin film may have a compressively strained symmetric phase disposed between o-phase domains.

The method may further comprise forming a support layer on the ferroelectric thin film. The ferroelectric thin film may be transferred using the support layer.

The ferroelectric thin film according to embodiments of the present invention is formed by the method.

FIG. 1 shows a method of forming a ferroelectric thin film according to an embodiment of the present invention.

Referring to FIG. 1, A LSMO (La$_{0.7}$Sr$_{0.3}$MnO$_3$) layer is formed on a 0.5 wt % Nb-doped STO (SrTiO$_3$) (001) substrate, and a 7% Y-doped HfO$_2$ thin film (Y:HfO$_2$ thin film) is formed on the LSMO layer. The LSMO layer is formed by epitaxial growth from the STO substrate using pulsed laser deposition (PLD), and the Y:HfO$_2$ thin film is formed by epitaxial growth from the LSMO layer. In the pulsed laser deposition process, the target used to form the Y:HfO$_2$ thin film may be formed by mixing hafnium oxide powder and yttrium oxide powder and then baking them at a high temperature. A mixing ratio of the hafnium oxide powder and the yttrium oxide powder may be determined according to a target content of components in the Y:HfO$_2$ thin film to be formed. The LSMO layer and the Y:HfO$_2$ thin film are grown in the <111> out-of-plane direction on the STO substrate. For the pulse laser deposition, a KrF excimer laser having a wavelength of 248 nm, an energy density of 2 J/cm$^2$ and a frequency of 6 Hz is used. The <111> oriented Y:HfO$_2$ thin film and LSMO layer are deposited at 700° C. under oxygen with a partial pressure of 150 mTorr. For electrical measurement of the Y:HfO$_2$ thin film, a Pt (30 nm thick) upper electrode may be formed using an e-beam evaporator.

A polymer support layer is formed on the Y:HfO$_2$ thin film. The polymer support layer may be formed by spin-coating a poly(methyl methacrylate) (PMMA) chlorobenzene solution, drop-casting a polypropylene carbonate (PCC) anisole solution onto the thin film, and then drying the layer.

The STO substrate is immersed in KI+HCl aqueous solution to dissolve and remove the LSMO layer. The floating free-standing thin film is taken out, washed twice with deionized water, and transferred to a quantifoil grid substrate. The free-standing thin film is dried at 40° C. for 1 hour to remove water and attached to the quantifoil grid substrate. The polymer support layer is dissolved by immersion in acetone for one day.

After forming epitaxial Y:HfO$_2$ thin films of various thicknesses, they are transferred to a quantifoil grid substrate for large-area in-plane observation.

Figure 2:
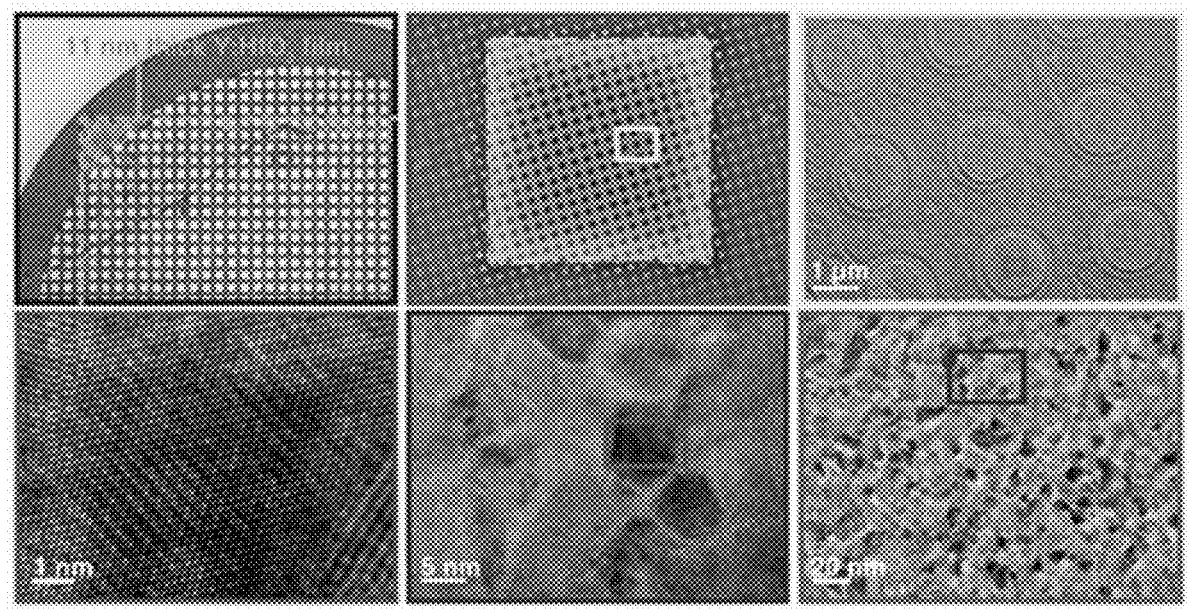
FIG. 2 shows an optical microscope image and a TEM image of a Y:$HfO_2$ thin film (11 nm thick) transferred to a quantifoil grid.

FIG. 2 shows an optical microscope image and a TEM image of a Y:HfO$_2$ thin film (11 nm thick) transferred to a quantifoil grid.

Referring to FIG. 2, the Y:HfO$_2$ thin film is disposed in a rectangular shape over the holes of the quantifoil grid substrate. As the magnification increases, the grain arrangement and atomic arrangement of the Y:HfO$_2$ thin film are clearly observed. Phase and strain analysis of the Y:HfO$_2$ thin films is possible with the wide observable area and advanced spatial resolution.

Figure 3:
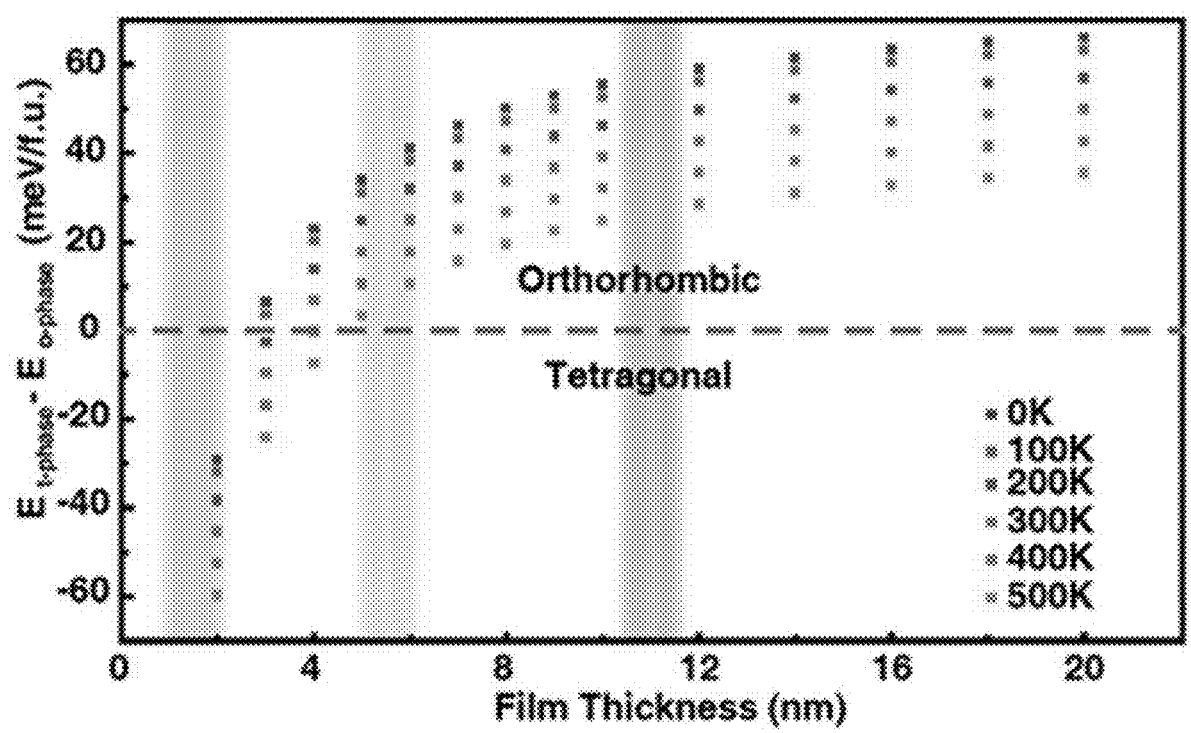
FIG. 3 shows phase transition simulations using density functional theory (DFT) calculations with respect to surface energy at various temperatures.
Figure 4:
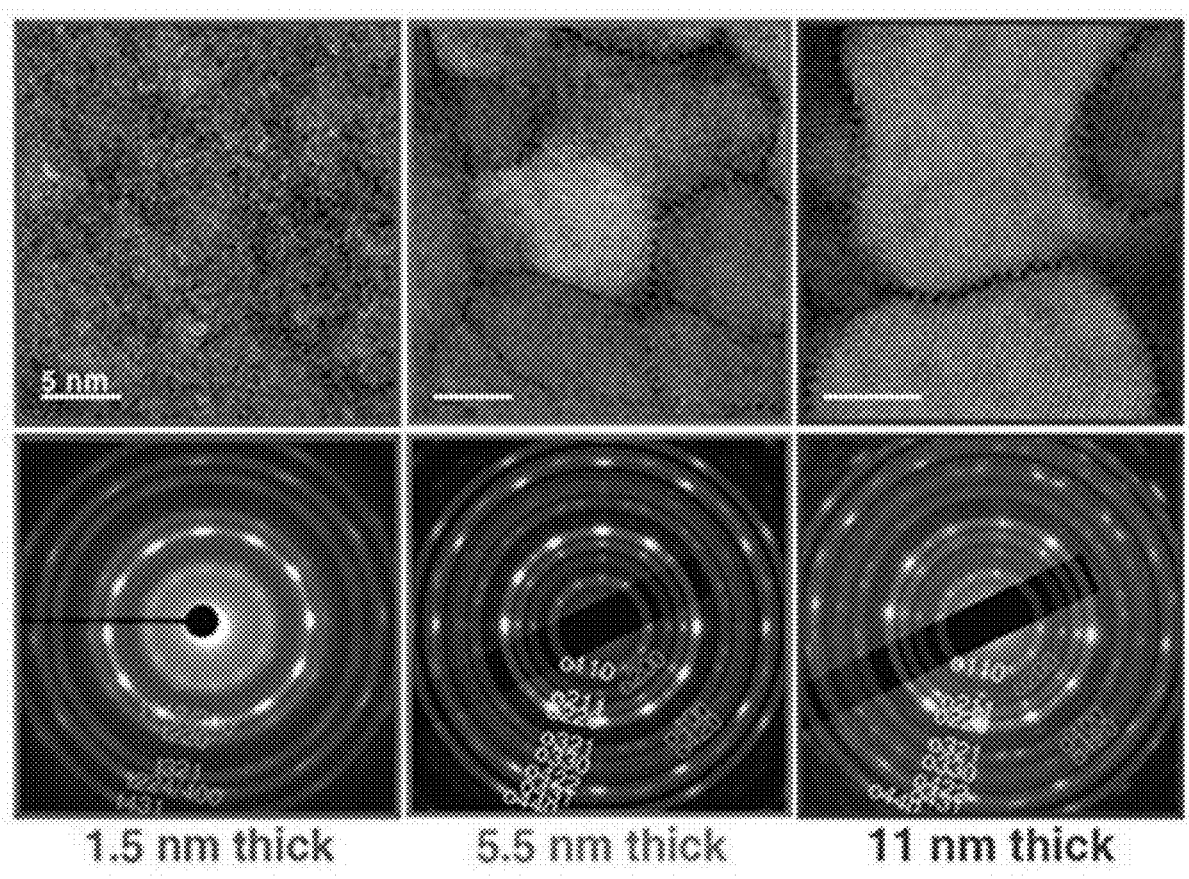
FIG. 4 shows Cs-STEM images and diffraction patterns of Y:$HfO_2$ thin films with thicknesses of 1.5 nm, 5.5 nm, and 11 nm.
Figure 5:
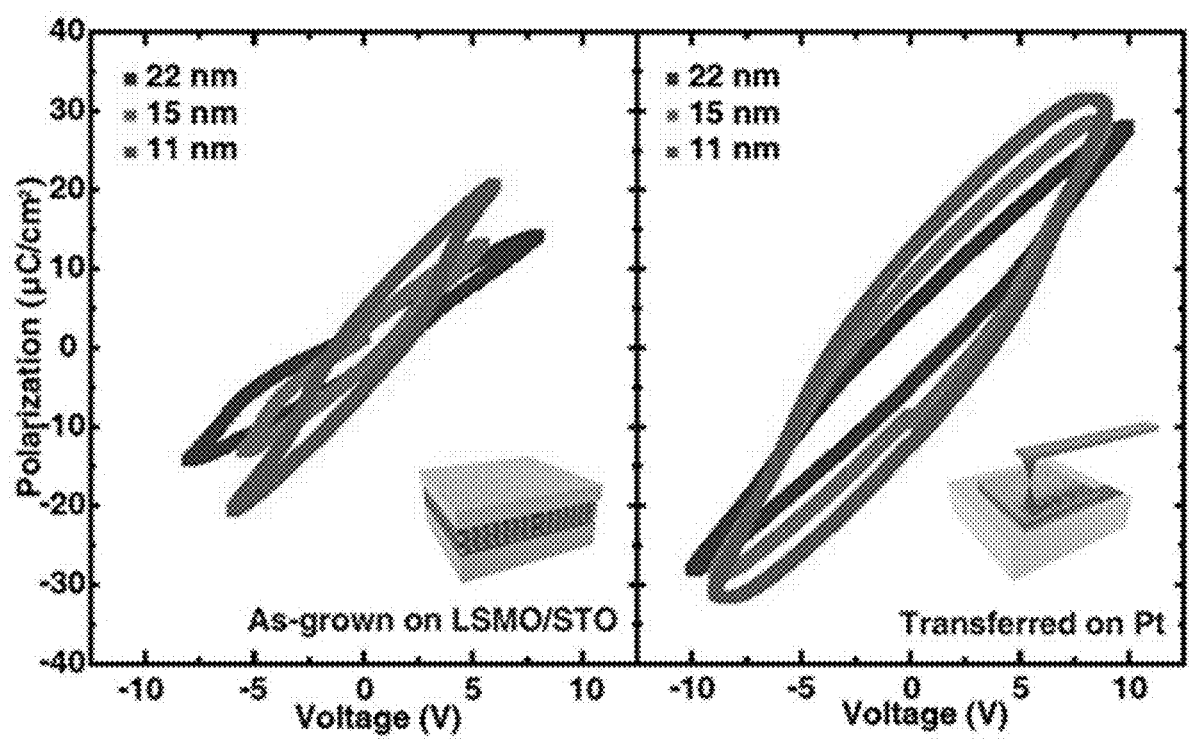
FIG. 5 shows P-E hysteresis curves of Y:$HfO_2$ thin films before and after transfer.

FIG. 3 shows phase transition simulations using density functional theory (DFT) calculations with respect to surface energy at various temperatures, FIG. 4 shows Cs-STEM images and diffraction patterns of Y:HfO$_2$ thin films with thicknesses of 1.5 nm, 5.5 nm, and 11 nm, and FIG. 5 shows P-E hysteresis curves of Y:HfO$_2$ thin films before and after transfer.

Referring to FIG. 3, the Y:HfO$_2$ thin film undergoes the transition from t-phase to o-phase at 3-4 nm thickness under 300 K.

Referring to FIG. 4, as the thickness of the Y:HfO$_2$ thin film increases, the grain size increases and the crystallinity of the thin film improves. The dodecagon-shaped electron diffraction patterns with peaks of o110/220 (11 nm, 5.5 nm) and t112/200 (1.5 nm) confirm that the thin films are epitaxially grown in the <111> direction where the domains are rotated by 90° from each other. According to the phase transition simulation (PTS) results, the o-phase is stable in thin films of 11 nm and 5.5 nm thickness, and the t-phase is stable in thin films of 1.5 nm thickness under 300 K. Accordingly, the 11 nm and 5.5 nm thick Y:HfO$_2$ thin films are mainly composed of o-phase and the 1.5 nm thick Y:HfO$_2$ thin films are mainly composed of t-phase.

Referring to FIG. 5, remanent polarization increases as the thickness of the Y:HfO$_2$ thin film decreases. The polarization of the films thinner than 11 nm cannot be measured due to the current leakage. The P-E hysteresis curves of the Y:HfO$_2$ thin films transferred to the Pt substrates show that the ferroelectricity is maintained or enhanced after the transfer. The enhancement of the ferroelectricity can be attributed to the Pt lower electrode and vanishment of interface defects such as oxygen vacancies or lattice dislocations formed between the LSMO layer and the Y:HfO$_2$ thin film.

Figure 6:
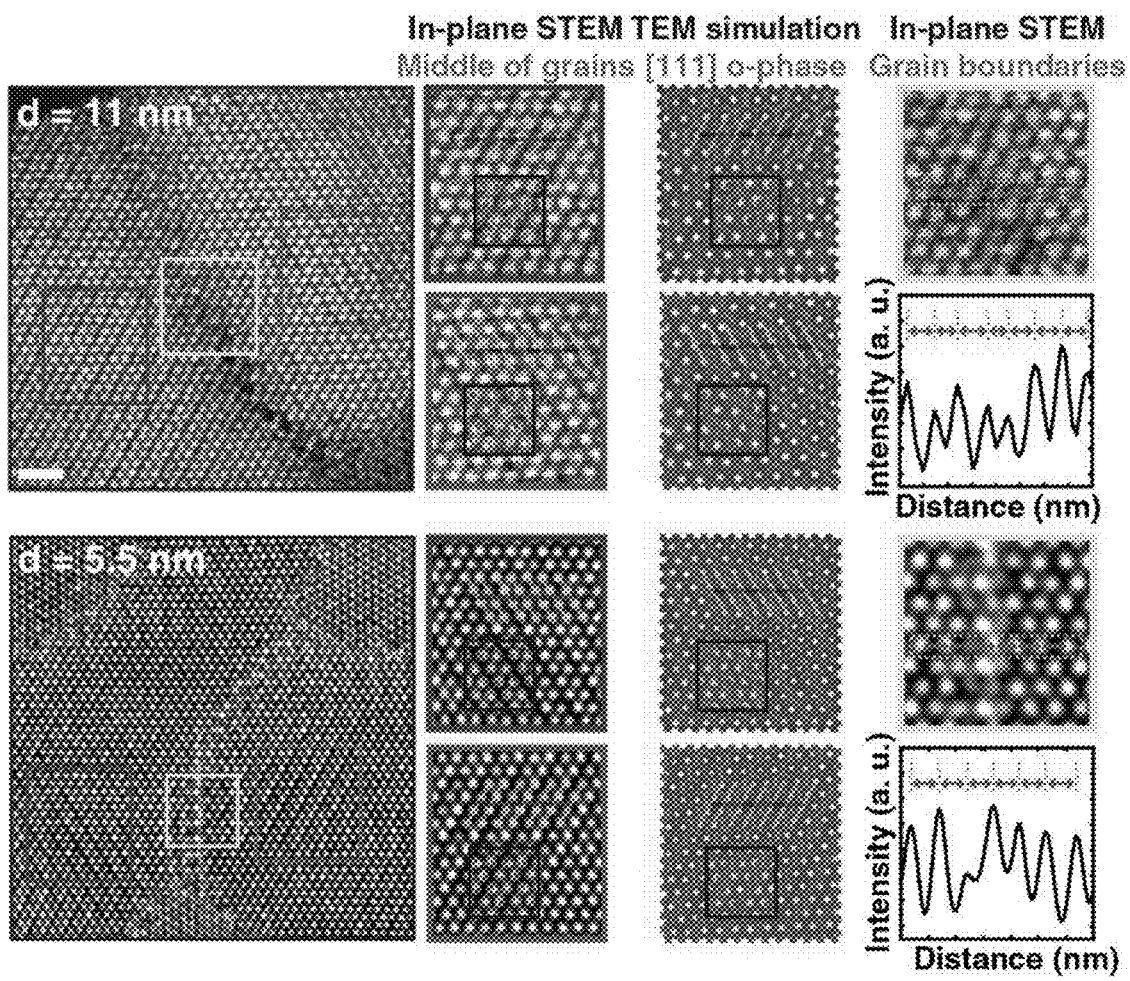
FIG. 6 shows Cs-STEM images and TEM simulation images of $HfO_2$ thin films having a thickness of 11 nm and 5.5 nm.
Figure 7:
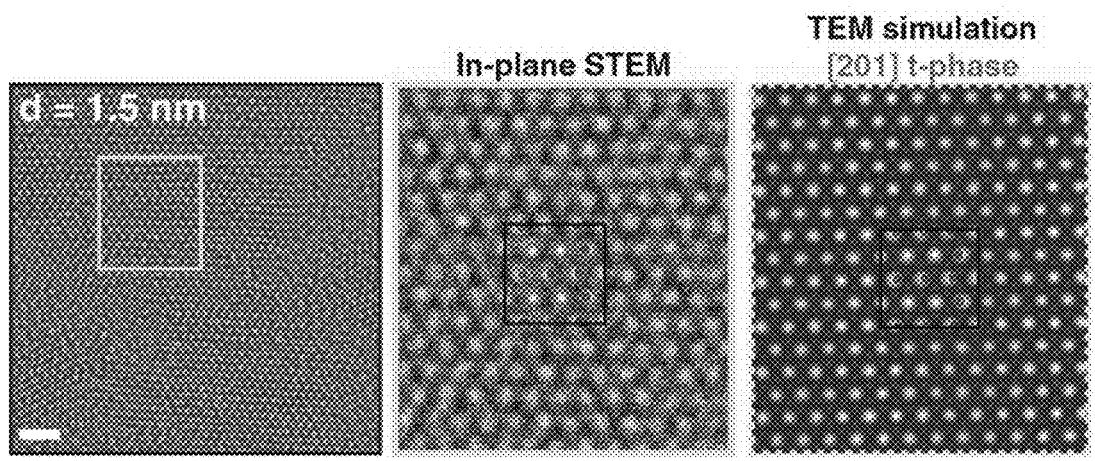
FIG. 7 shows a Cs-STEM image and a TEM simulation image of a $HfO_2$ thin film having a thickness of 1.5 nm.

FIG. 6 shows Cs-STEM images and TEM simulation images of HfO$_2$ thin films having a thickness of 11 nm and 5.5 nm, and FIG. 7 shows a Cs-STEM image and a TEM simulation image of a HfO$_2$ thin film having a thickness of 1.5 nm.

Referring to FIG. 6, performing in-plane STEM and TEM imaging not only greatly improves the spatial resolution compared to conventional STEM and TEM images since the electron beam penetrates the thin films with minimum interference, but also greatly expands the observable space. For the HfO$_2$ thin films with 11 nm and 5.5 nm thickness, the Cs-STEM images show repeating patterns in the middle of the grain where the o-phase is expected to be formed. TEM simulations are performed on the o-phase in [111] direction to clarify the crystallographic structure, and the simulated images show an identical atomic arrangement to the in-plane STEM images at the middle of the grains.

The atomic structure of the HfO$_2$ thin film becomes symmetric near the intergrain area, which is interpreted as the formation of other phases rather than the o-phase. The repetitive patterns observed in the o-phase disappear, and the distances between atoms become constant. Also, the atomic distances are greatly shrunk at the grain boundaries. Strain maps generated by geometric phase analysis (GPA) show that the compressive strain over 10% is perpendicularly applied to the grain boundaries.

Referring to FIG. 7, the t-phase is stabilized in the $HfO_2$ thin film with a thickness of 1.5 nm. Both the TEM simulation image of the t-phase in [201] and the in-plane STEM image are exactly overlaid with the atomic model. Unlike the 11 nm and 5.5 nm thin films, the strain around the grain boundaries in the 1.5 nm thin film is not observed. Because the t-phase and o-phase are almost indistinguishable by XRD or electron diffraction, and exhibit detailed atomic patterns that are nearly imperceptible by other methods, they are only distinguishable using in-plane STEM imaging methods.

Figure 8:
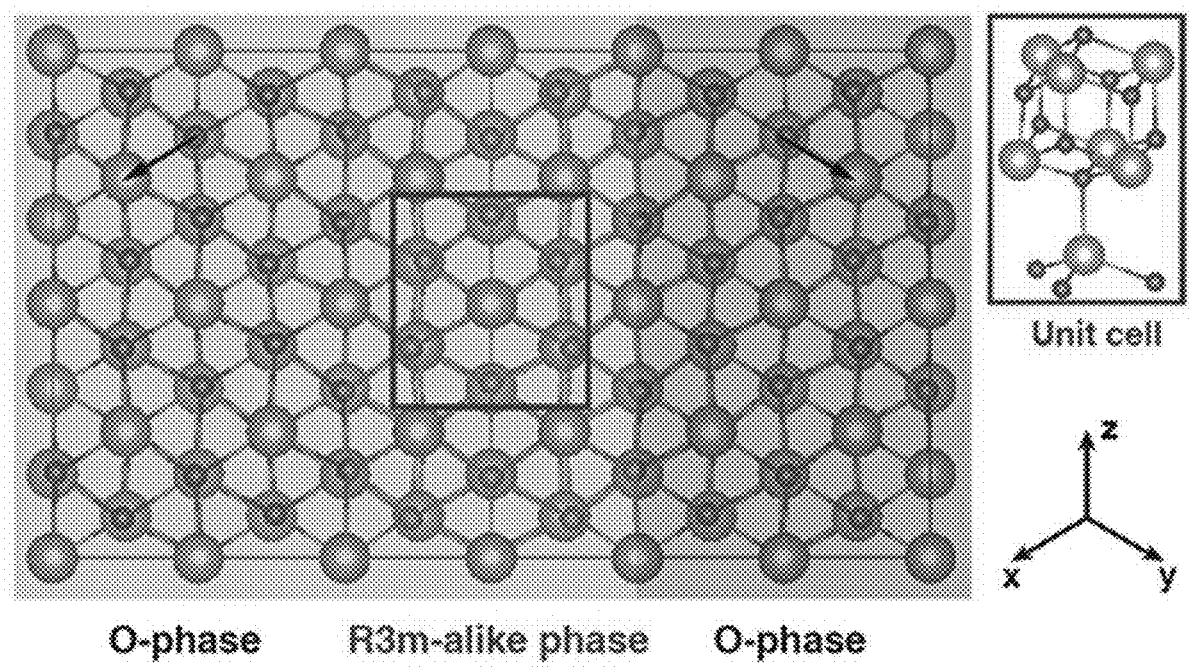
FIG. 8 shows atomic simulations of $HfO_2$ thin films based on DFT calculations.

FIG. 8 shows atomic simulations of $HfO_2$ thin films based on DFT calculations, and FIG. 9 shows the change in the amplitude of $\Gamma_{15}^x$, $\Gamma_{15}^y$, $\Gamma_{15}^z$ phonons according to the tensile strain in the {111} lattice of the $HfO_2$ thin film.

Referring to FIGS. 8 and 9, the symmetric phase at boundaries can be identified by performing first-principles simulations based on DFT calculations. The atomic model of FIG. 8 imitates the situation where two o-phase domains directing <111> are attached at an angle of 120 degrees. Relaxation at the interdomain area causes phonon coupling that generates a polar R3m-alike phase. The R3m-alike phase possesses induced phonon modes including $X'_1$, $Y'_2$, $Z'_2$, $X_1$, $Y_1$, $Z_2$, $\Gamma_{15}^x$, $\Gamma_{15}^y$, $\Gamma_{15}^z$ phonons. Among these phonons, the $\Gamma_{15}^y$, $\Gamma_{15}^z$ phonons generates a uniform polarization in the <111> direction as all oxygen atoms move along the x, y, and z axes, respectively. The induced phase exhibits about 16 times stronger polarization than the r-phase in the absence of strain.

As the distance between the two domains decreases, a stronger out-of-plane tensile strain is applied in the <111> direction. As shown in FIG. 9, the elongated {111} lattice greatly increases the amplitude of $\Gamma_{15}^x$, $\Gamma_{15}^y$, $\Gamma_{15}^z$ phonons, which means the enhancement of ferroelectricity.

As above, the exemplary embodiments of the present invention have been described. Those skilled in the art will appreciate that the present invention may be embodied in other specific ways without changing the technical spirit or essential features thereof. Therefore, the embodiments disclosed herein are not restrictive but are illustrative. The scope of the present invention is given by the claims, rather than the specification, and also contains all modifications within the meaning and range equivalent to the claims.

What is claimed is:

1. A method of forming a ferroelectric thin film comprising:
   forming a sacrificial seed layer on a first substrate;
   forming a ferroelectric thin film on the sacrificial seed layer; and
   transferring the ferroelectric thin film to a second substrate,
   wherein the first substrate comprises a STO ($SrTiO_3$) substrate, the sacrificial seed layer comprises a LSMO ($La_{0.7}Sr_{0.3}MnO_3$) layer, and the ferroelectric thin film comprises a $HfO_2$ thin film.

2. The method of claim 1, wherein the $HfO_2$ thin film is doped with yttrium (Y).

3. The method of claim 1, wherein the ferroelectric thin film is formed by epitaxial growth from the sacrificial seed layer.

4. The method of claim 1, wherein the transferring of the ferroelectric thin film comprises removing the sacrificial seed layer.

5. A method of forming a ferroelectric thin film comprising:
   forming a sacrificial seed layer on a first substrate;
   forming a ferroelectric thin film on the sacrificial seed layer; and
   transferring the ferroelectric thin film to a second substrate,
   wherein the crystal structure of the ferroelectric thin film is controlled by the thickness of the ferroelectric thin film.

6. The method of claim 5, wherein the ferroelectric thin film comprises a $HfO_2$ thin film, and
   wherein the $HfO_2$ thin film is composed of t-phase at a first thickness and composed of o-phase at a second thickness greater than the first thickness.

7. The method of claim 6, wherein the ferroelectric thin film comprises a $HfO_2$ thin film, and
   wherein the $HfO_2$ thin film has a compressively strained symmetric phase disposed between o-phase domains.

8. The method of claim 7, further comprising forming a support layer on the ferroelectric thin film,
   wherein the ferroelectric thin film is transferred using the support layer.

9. A ferroelectric thin film formed by the method of claim 1.

10. A ferroelectric thin film formed by the method of claim 5.

* * * * *